(12) United States Patent
Wehrhan et al.

(10) Patent No.: US 7,868,708 B2
(45) Date of Patent: Jan. 11, 2011

(54) METHOD AND APPARATUS FOR MAKING A HIGHLY UNIFORM LOW-STRESS SINGLE CRYSTAL BY DRAWING FROM A MELT AND USES OF SAID CRYSTAL

(75) Inventors: Gunther Wehrhan, Jena (DE); Lutz Parthier, Kleinmachnow (DE); Daniel Rytz, Herborn (DE); Klaus Dupre, Idar-Oberstein (DE); Lothar Ackermann, Idar-Oberstein (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 12/328,879

(22) Filed: Dec. 5, 2008

(65) Prior Publication Data

US 2009/0176081 A1     Jul. 9, 2009

Related U.S. Application Data

(62) Division of application No. 11/519,603, filed on Sep. 11, 2006, now Pat. No. 7,476,274.

(30) Foreign Application Priority Data

Sep. 13, 2005    (DE) ................ 10 2005 043 623

(51) Int. Cl.
*H03B 5/00* (2006.01)
*H03B 7/06* (2006.01)

(52) U.S. Cl. .................. 331/107 R; 331/116 M; 331/154

(58) Field of Classification Search ............. 331/107, 331/116, 154, 193
See application file for complete search history.

(56) References Cited

U.S. PATENT DOCUMENTS

| | | | | |
|---|---|---|---|---|
| 3,974,389 A | * | 8/1976 | Ferri et al. | 250/483.1 |
| 4,405,691 A | * | 9/1983 | Yale | 428/690 |
| 4,421,671 A | * | 12/1983 | Cusano et al. | 252/301.4 F |
| 6,630,077 B2 | * | 10/2003 | Shiang et al. | 252/301.4 R |
| 6,793,848 B2 | * | 9/2004 | Vartuli et al. | 252/301.4 R |
| 6,995,374 B2 | * | 2/2006 | Lefaucheur et al. | 250/370.11 |
| 7,008,558 B2 | * | 3/2006 | Vartuli et al. | 252/301.4 R |

(Continued)

FOREIGN PATENT DOCUMENTS

JP         04-097989         3/1992

(Continued)

*Primary Examiner*—Robert M Kunemund
*Assistant Examiner*—G. Nagesh Rao
(74) *Attorney, Agent, or Firm*—Michael J. Striker

(57) ABSTRACT

The method of making uniform low-stress crystals includes immersing a seed crystal held at a temperature under its melting point in a melt in a crucible and drawing it from the melt. The crystal and/or melt are rotated relative to each other and a planar phase boundary surface is maintained between them by detecting a surface temperature of the melt and/or crystal and controlling temperature fluctuations by increasing or decreasing the rotation speed. The single crystals obtained by this method have a diameter $\geqq 50$ mm and no visible growth strips in a fishtail pattern when a 2-mm thick sample is observed between crossed polarizers. These crystals have an index of refraction uniformity $\Delta n$ of <1 ppm and a stress birefringence of <1 nm/cm at 193 nm, so that optical elements suitable for DUV lithography can be made from them.

8 Claims, 4 Drawing Sheets

U.S. PATENT DOCUMENTS

| | | | |
|---|---|---|---|
| 7,019,284 B2* | 3/2006 | Srivastava et al. | 250/256 |
| 7,347,956 B2* | 3/2008 | Fukuda et al. | 252/301.4 R |
| 7,420,219 B2* | 9/2008 | Kang et al. | 257/98 |
| 7,592,192 B2* | 9/2009 | Nabeta et al. | 438/22 |
| 7,605,373 B2* | 10/2009 | Srivastava | 250/361 R |
| 2001/0008116 A1* | 7/2001 | Melcher et al. | 117/13 |
| 2002/0195587 A1* | 12/2002 | Srivastava et al. | 252/301.4 R |
| 2006/0027742 A1* | 2/2006 | Srivastava et al. | 250/256 |
| 2007/0056505 A1* | 3/2007 | Wehrhan et al. | 117/13 |
| 2007/0138942 A1* | 6/2007 | Ikada et al. | 313/503 |
| 2007/0164300 A1* | 7/2007 | Nabeta et al. | 257/98 |
| 2008/0128623 A1* | 6/2008 | Srivastava | 250/361 R |
| 2009/0176081 A1* | 7/2009 | Wehrhan et al. | 428/220 |

FOREIGN PATENT DOCUMENTS

| | | |
|---|---|---|
| JP | 06-128075 | 5/1994 |
| JP | 06-183877 | 7/1994 |
| JP | 10-251090 | 9/1998 |
| JP | 2000-063196 | 2/2000 |

\* cited by examiner

METHOD AND APPARATUS FOR MAKING A HIGHLY UNIFORM LOW-STRESS SINGLE CRYSTAL BY DRAWING FROM A MELT AND USES OF SAID CRYSTAL

CROSS-REFERENCE

This is a divisional filed under 35 U.S.C. 120 of U.S. patent application Ser. No. 11/519,603, which was filed in the U.S. Patent Office on Sep. 11, 2006 now U.S. Pat. No. 7,476,274.

BACKGROUND OF THE INVENTION

1. The Field of the Invention

The present invention relates to a method of making highly homogeneous low-stress single crystals with a predetermined orientation by immersing a single crystal in a melt and slowly drawing the single crystal out of the melt while crystallization is occurring, to an apparatus for performing the method of making the single crystals, and to the single crystals made by the method and their uses.

2. Related Art

The use of crystalline material for making lenses and optical elements is known. Particularly integrated circuits made by photolithography require large-volume calcium fluoride single crystals, which are permeable to short wavelength light up to a working wavelength of about 130 nm. Increasing requirements for increasingly higher integration density result in further miniaturization of structural elements and require forming increasingly smaller structures in the photolithograph processing. For these reasons immersion techniques used in microscopy have already been suggested for making computer chips. In these methods the optical element, through which the projected light from the objective passes, is dipped in an immersion liquid. In this way it is possible to increase the aperture angle and thus the resolution and the depth of focus. However the size of the actual objective aperture angle depends on the index of refraction of its terminal lens or front lens in the projection system. The index of refraction of $CaF_2$ of 1.5 does not meet the requirements of the 32-nm technology points. Highly refractive crystals, especially oxides of rare earths, such as YAG, LuAG, and GGG (Gadolinium-Gallium-Garnet), which all have an index of refraction greater than 1.75, are generally used for those applications. These types of crystals are economical crystals used for making laser rods. When they are used for making laser rods, they are doped during the growing process. Laser rods with a maximum 10 mm diameter are drilled out from low-stress regions of the drawn crystals. Since these laser rods have the above-described reduced dimensions, crystal diameters of about 50 mm have already been obtained. These dimensions are essentially too small for making lens blanks for projection objectives of a stepper and their optical quality (index of refraction uniformity, stress birefringence, DUV transmission) is completely unsatisfactory.

The making of this sort of crystal generally occurs by drawing or by dipping a crystal seed in a melt of crystal raw material and by slowly drawing the crystal seed from the melt while crystallizing to form the solid crystal. The so-called Czochralski method, with which single crystals of high melting oxides, such as sapphire ($Al_2O_3$), garnet, YAG ($Y_3Al_5O_{12}$), and spinel ($MgAl_2O_4$) are made, is usually used in industrial scale production. The crystals made in commercially available apparatus are drawn from iridium crucibles at melting temperatures up to 2000° C.

Up to now however this technology cannot produce crystals that meet the requirements for optical elements in lithography steppers. These optical elements must have diameters of at least 100 mm, especially 150 to 200 mm and, at the same time, the required optical uniformity parameters, such as a stress-induced birefringence of less than 1 nm/cm at 193 nm and an index of refraction uniformity of $\Delta n$ less than 1 ppm.

If grown crystals are used for the above-described application in photolithography, they must have diameters of up to about 200 nm or larger and the required optical uniformity properties over at least 80% of the crystal diameter and at least 100 mm of the cylindrical product crystal. Only then may e.g. lens blanks with a diameter of about 150 mm and a thickness of about 40 mm be made from the grown crystals. Furthermore this sort of crystal must be economical and must have reproducible quality.

Usually a convex growth cone, which extends into the melt, arises in a growing crystal during growth of the crystal from an oxidic melt according to the Czochralski method or a method derived from it, such as the so-called "Top Speed Solution Growth Method" (TSSG). This cone is produced, above all, because the energies released during crystallization is conducted away by the crystal. The curvature of the growing face of the crystal depends on the thermal properties of the crystal and the melt and their interaction.

Now it is known that the convection flow in the melt present in the crucible is poor, so that heating by means of a heating element arranged on or in the crucible wall produces a free or basic convection. The melt heated at the crucible wall rises and the slightly cooler melt in the center of the crucible sinks downward. A circular, rotationally symmetric free convection from the outside to the inside is produced in this way. On the other hand, the upper part of the melt is rotated together with the rotating crystal extending into the melt, so that the denser melt cooled at the crystal is conducted by the centrifugal forces to the crucible wall and sinks there until captured by the free convection flow and again conducted to the center of the crucible. Thus the rotating crystal produces a forced convection, which behaves in an opposite manner to the above-described free convection, which is produced by heating. The forced and free convection are approximately mirror symmetric to each other in relation to the planar crucible cross-section.

However these opposing flow and convection processes are unstable and especially easily changed by changing the temperature profile in the crucible or the rotation speed. The resulting fluctuations and/or instabilities of the temperature act directly on the growth process at the phase boundaries between the crystal and melt and bring about fluctuations in the growth speed, which produce troublesome contrasting strips (growth strips or striations) in the finished crystal. Such contrast strips are produced by fluctuations of the lattice constants and thus the index of refraction. They impair the optical uniformity of the crystal. They are observable without more by known observation methods, such as examination between crossed polarizers or X-ray methods.

It has now been shown that the condensation heat released by condensation at the phase boundary surface produces temperature oscillations and thus the undesirable growth strips, which are still observable in the finished crystal. If a crystal of this sort is cut along its center axis, then a fishtail pattern produced by so-called striations produced by temperature fluctuations of any sort, is visible, especially in observation between crossed polarizers. If an optical element, such as a lens, is made from this sort of crystal, then it has a ring-like arrangement of differing refractive indexes similar to the growth rings of a tree. Thus a lens of this type is no longer useable for the above-described application. These types of structure defects characterized as growth strips arise themselves in unitary systems, in which distribution inhomogeneities do not occur. However it has been shown that this strip formation arises by changes and/or fluctuations in the growth conditions, especially the growing speed, which are ascribed to changes in the growing speed v and the hypothetical diffusion boundary layer thickness, $\delta$, wherein the diffusion coefficient is a constant. These striations are formed by complex, currently not understood fluctuations in the growing speed and the transport processes at the growth front.

Currently it is not possible to keep the behavior of the convection reproducible over the entire growth period due to the competition between natural convention and forced convection. If natural convection dominates the convection processes, a convex phase boundary arises with the development of growth facets and a tendency to form growth strips. If forced convection dominates the convection processes, an especially undesirable concave phase boundary arises with all the negative effects of growth defects.

The current control methods for drawing speed, rotation speed, and optionally heating power depending on the crystal weight, which are practiced according to the state of the art, have not been sufficient for that purpose.

Many experiments for improving the uniformity of the crystals that have been grown have already been undertaken. Thus DD 290 921 described improvements in the uniformity of the garnet crystals made according to the Czocharalski method, when they are grown so that the phase boundary surface has an inclination angle, relative to the crystallographic (111) plane of 44±5° or 0±10° C. This phase boundary inclination angle is kept constant during the growing process by variation of the rotation speed.

DE 390 59 66 A1 describes growth of crystals for laser applications according to the Czochralski method, and of course especially of Nd:YAG crystals in the crystallographic (100)-direction or (111)-direction, in which the inclination angle of the phase boundary surface should be less than or equal to 35° for the (100)-direction and 44±5° for the (111)-direction. Here also the inclination angle should be maintained constant by variation of the rotation speed, once it is set. This procedure was selected, since all attempts to adjust a planar phase boundary were viewed as clever in the state of the art at that time, since the course of the phase boundary could not be reproducibly adjusted. Although this method already produces improvements in the uniformity properties of the crystals, the crystals still do not have the uniformity required for optical elements.

SUMMARY OF THE INVENTION

It is an object of the present invention to provide single crystals, especially high melting oxidic crystals, which do not have the above-described growth strips, especially those with a fishtail pattern, or which do not have them to a troublesome extent.

It is a further object of the present invention to provide a method of making the crystals according to the invention, which can be performed with a comparatively simple apparatus, which can be built from commercially obtainable parts.

It is an additional object of the present invention to provide a method of growing various single crystals with large diameters, which is especially based on the Czochralski method.

These objects and others, which will be made more apparent hereinafter, are attained in a method of making highly uniform, low-stress single crystals in a predetermined orientation from a melt, which has a melt surface and comprises melted crystal raw material. This method comprises dipping a single crystal kept at a temperature under the melting point of the crystal raw material in the liquid melt so as to form a solid-liquid phase boundary surface, drawing the said single crystal out from the melt vertically relative to the melt surface in order to grow the single crystal in the predetermined crystal orientation, conducting heat away while drawing the single crystal out of the melt, and rotating the single crystal and the melt relative to each other with a controllable rotation speed.

According to the invention at least one characteristic surface temperature in is detected in an interior of a crucible containing the melt from which the single crystal is drawn and, when temperature fluctuations are detected, the at least one characteristic surface temperature is controlled by increasing or decreasing the rotation speed of the single crystal and melt relative to each other in order to control the at least one characteristic surface temperature and to adjust the phase boundary surface between the single crystal and the melt so that it is planar.

The invention is based on the understanding that additional small convective whirlpools or vortices, which can be observed only poorly or not at all, typically accompany the appearance of convection, like that occurring in forced convection (e.g. spiral-shaped arms).

It has now been found that these convection vortices produce temperature oscillations, so that the central temperature at the surface of the crystal melt varies. The surface thus radiates different amounts of heat energy. According to the invention these fluctuations are detected in the heat radiation from the surface of the crystalline melt and serve as signals for control and/or control of the rotation speed of the crystal, in order to readjust the equilibrium between the natural and forced convection coming from the balance.

The detection of heat radiation from the surface of the crystal melt can take place in different ways. A first possibility is that a temperature sensor is mounted above the melt (e.g. a thermo-element, a pyrometer, or a thermo-vision camera). Preferably the temperature sensor is amounted on the upper side of an after-heating chamber arranged above the melt for receiving the already grown crystal. A second possibility is that the temperature of the outer surface of the crystal drawn of the melt could be measured. Preferably the outer surface of the freshly grown crystal is measured appropriately close to the melt surface. In a preferred embodiment the temperature of the crystal surface and/or its fluctuations within a maximum spacing of 150 mm, especially a maximum spacing of 100 mm, of the melt surface, are detected The temperature and/or its fluctuations are e.g. detected by a pyrometer or a thermo-vision camera. The detection can occur for example through the casing or jacket of the after-heating chamber. If a change of the surface temperature from a previous surface temperature is detected, the rotation speed is either increased or decreased until the surface temperature again reaches the previous surface temperature. A suitable temperature is reached when it corresponds to the continual development and/or trend. It has been shown that the base and/or average value of the measured signal drifts during increasing growth because of a continuously increasing spacing of the sensor and the surface of the consumed melt, so that the respective surface temperature should be adjusted along a drift curve without more.

In this way it is possible to draw a large crystal, especially with a planar growth front, from the melt, in which no or only slight detectable growth rings are present. Above all, the crystals made according to the invention have scarcely any fishtail pattern, since a flat planar growth front is produced in the procedure according to the invention.

The method according to the invention is preferably performed with an after-heating system. This crucible after-heating system comprises an after-heating chamber arranged over the melting chamber analogous to a pot, which receives the already prepared drawn crystal pieces. The interior surface of this after-heating system preferably is made of the same material as the crucible, which receives the melted fluid crystal mass. It is thermally insulated on its outer side in order to reduce heat losses. The after-heating chamber preferably has as high as possible a temperature during the growing of the large-diameter crystal, which produces minimum radial and/or axial temperature gradients. This temperature is greater than 1400° C., preferably greater than 1600° C., and especially preferably greater than 1800° C. This is achieved because the after-heating chamber provides as uniform planar heat transfer as possible and is the first of this type of after-heating system. In this way the crystal can directly experience an after-tempering from the above-mentioned temperature to room temperature, which leads to a further reduction of the stress-induced birefringence.

During the growth of the crystal the uniform temperature field at a high temperature level causes an additional reduction of the interfering influences on the surface temperature of the melt. This thus leads to a reduction of the temperature fluctuations in the melt at the high temperature existing there. It is also possible to control the diameter of the growing crystal by means of the temperatures existing in the after-heater, alone or in combination with other growth parameters.

The adjustment of a high temperature in the after-heating chamber is assisted by known measurement techniques, because the already mentioned second possibility for temperature measurement is used, in which a pyrometer or a thermo-vision camera measures the outer surface temperature of the cylindrical crystal through an opening in the casing or jacket of the after-heating chamber. This opening in the after-heating chamber can be used simultaneously as the inlet for the inert gas during the growth and/or after-tempering. The crystal growth is preferably performed under an inert gas atmosphere. Also the positive effects, i.e. the improvements in the index of refraction uniformity and stress birefringence, are strengthened or increased under the influence of inert gas, even during the tempering. The inert gas can also naturally be supplied in the same way through the opening in the upper end of the after-heating chamber when the pyrometer or thermo-vision camera is used for the already mentioned first method of temperature measurement.

The temperature measurement used for adjustment of the temperature level in the after-heating chamber can of course occur by thermo-elements (above or on the outer surface) mounted protruding from the inner shell of the after-heating chamber or by pyrometric measurement of the inner shell of the after-heating chamber from the exterior.

The after-heating chamber formed as an after-heating system provides an additional advantage, which is that a diaphragm built in between the crucible and the after-heating chamber permits a separation of both regions and separate temperature control of both regions, but with certain limitations due to its opposing influences. However an opening must still be permitted in the diaphragm to permit measurement of the surface temperatures at measurable locations for average surface temperature fluctuations.

The above-mentioned average temperature changes on the surface of the crystal melt, which are considered to be critical and thus to be controlled, preferably are measured by means of the following temperature sensors.

Thermistors or thermo-elements, such as a thermocouple based on the Seebeck effect, radiation thermometers (pyrometer), especially with a suitable analyzer of integral or spectral effects of the radiation, which is radiated from the surface of a heated body, or a radiation sensor (pyrometric sensor), which detects the direct radiation changes at the structural element on the basis of solid body physical effects, are all useable. It is essential for the present invention that the heat, which is radiated from the surface of the melt, is detected. No interruption of the heating of the crystal and the melt occurs because of the detection of the heat radiated from the melt surface.

When thermo-elements or thermistors are used, then they are preferably arranged on the outside of the after-heating pot, which is above the melt. An exact measurement of the temperature is not necessary for performing the method according to the invention. Furthermore the temperature sensor that is used must be able to detect small temperature fluctuations of at most ±5° C., especially ±1° C. and especially at most ±0.5° C. and/or ±0.1° C. at high melt temperatures of over 2000° C.

The measurement of changes of the central temperature of the melt surface is appropriately performed in connection with already known temperature measurements. Temperature measurements at the underside of the crucible, which contains the crystal melt, are already known in the prior art. This occurs, for example, by means of thermo-elements spaced from the bottom of the crucible. A temperature measurement of the crucible wall temperature by a pyrometer from below is just as possible. It is also possible to measure the temperature of the melt of the crystalline material from above or from below by pyrometric means.

Especially oxides, such as rare earth oxides, and/or corundum crystals, garnet, and spinel, are especially suitable crystal materials for use in the method according to the invention. The preferred rare earth materials comprise especially YAG, LuAG, and GGG. Especially preferred materials have a Prandtl number of about 1 at the growth temperature. The Prandtl number is a dimensionless characteristic number for fluid flow and is defined as the ratio between the kinematic viscosity and the thermal diffusivity. The method according to the invention is also suitable for making crystals, which are used to make wafers for LED lights.

The purity of the starting material for the method of making the crystals according to the invention should be of the so-called 5N (i.e. 5 nine) purity, also at least 99.999% pure. Rare earth and alkali impurities are especially critical and thus should be avoided in the starting material. Starting material with a purity of 6N are even more preferably, so that 6N crystals may be obtained. Large volume, doped crystals (e.g. Nd:YAG) of improved quality and improved volume yield are obtained by means of the method according to the invention. Even in the case of making doped crystals, in which of course in contrast to undoped crystals pronounced growth strips can occur, quality advantages still can be obtained due to increased volume yields during manufacture.

In this way it is also possible to manufacture laser rods with the methods according to the invention with a diameter greater than 10 mm.

BRIEF DESCRIPTION OF THE DRAWING

The objects, features and advantages of the invention will now be illustrated in more detail with the aid of the following description of the preferred embodiments, with reference to the accompanying figures in which.

DETAILED DESCRIPTION OF THE INVENTION

Figure 1:
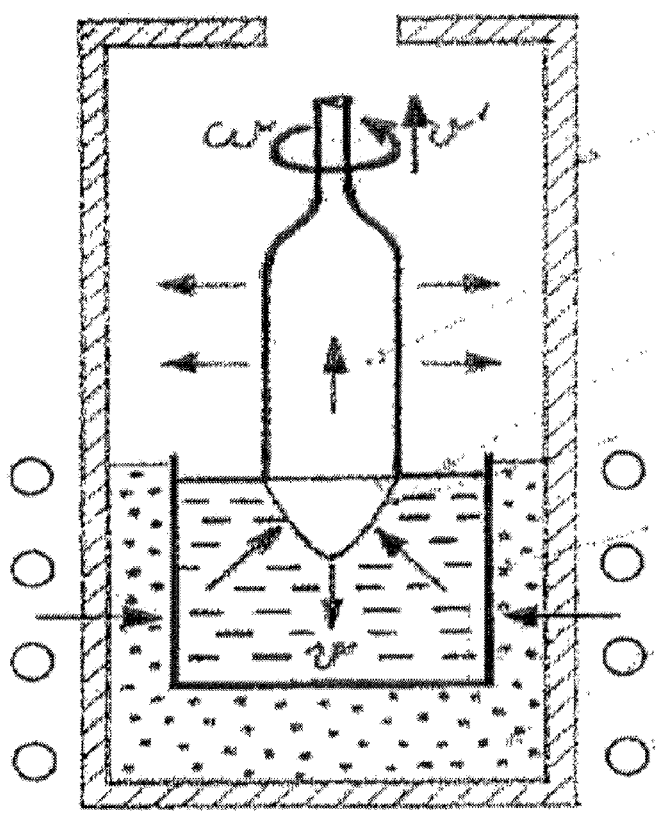
FIG. 1 is a schematic cross-sectional view illustrating crystal growth according the Czochralski method.
Figure 2A:
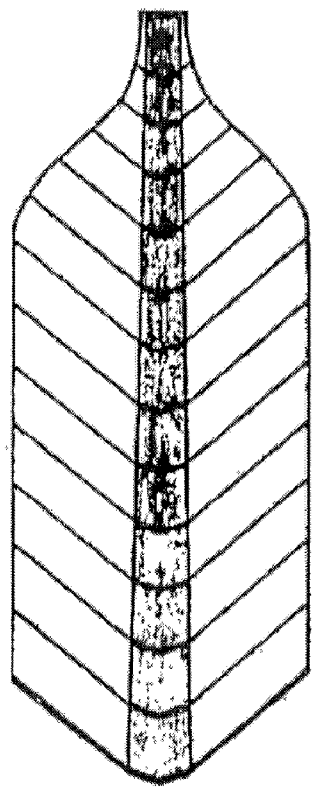
FIG. 2a is a cross-sectional view through a crystal with fishtail striations prepared according to a prior art method.
Figure 2B:
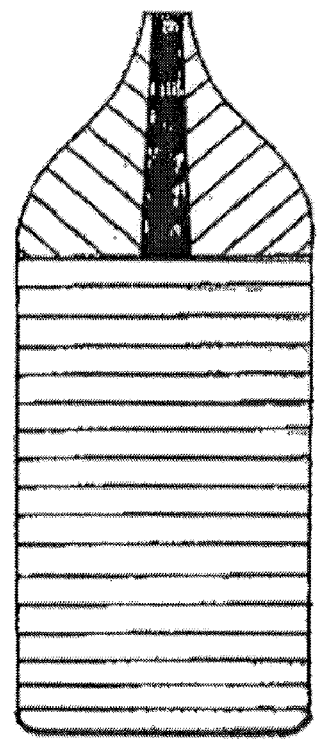
FIG. 2b is a cross-sectional view through a crystal obtained according to the method of the present invention, which is similar to the crystal shown in FIG. 2b, but which has a planar growth front with only some weakly detectable growth strips.
Figure 3:
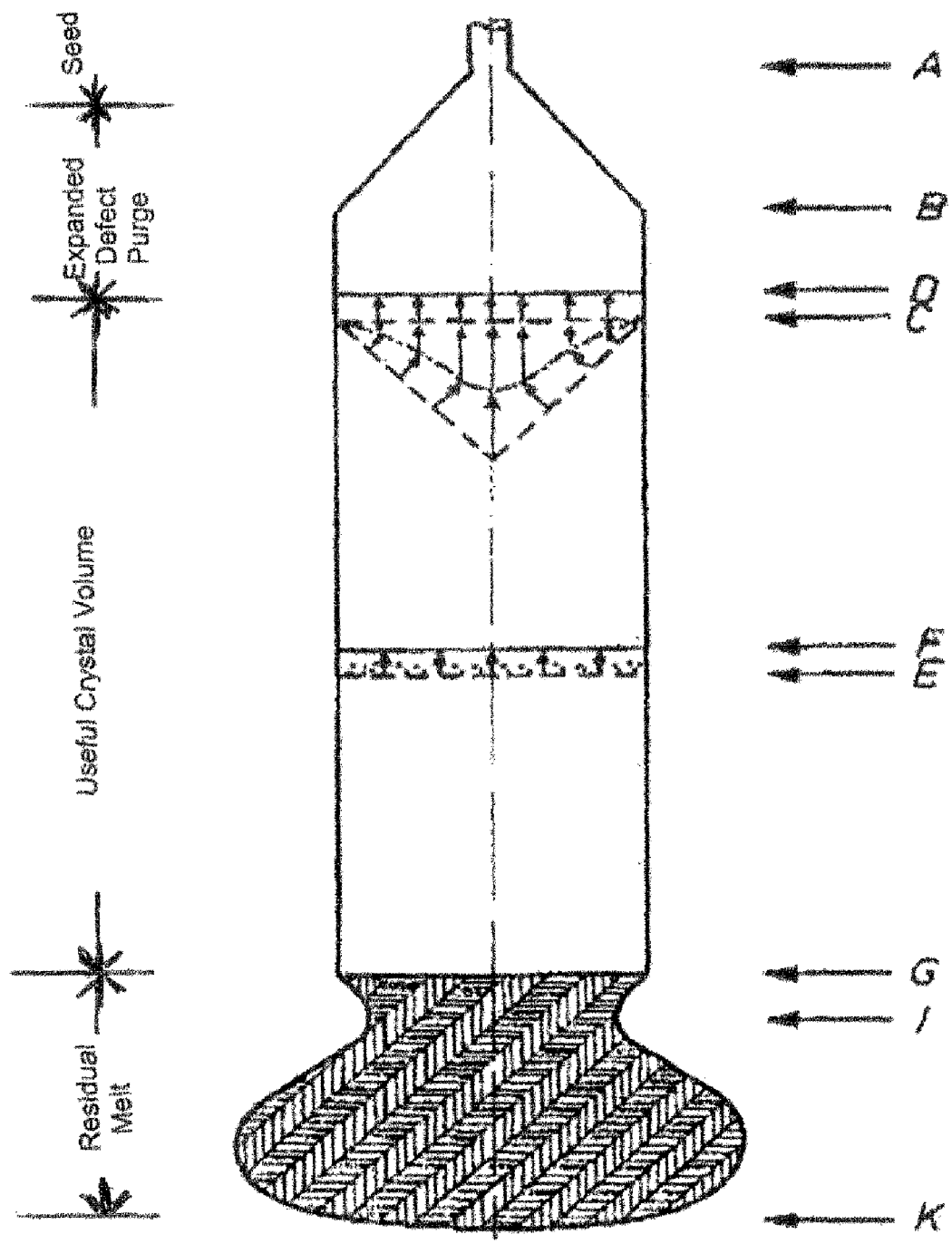
FIG. 3 is a diagrammatic view of the crystal according to the invention with its different growth stages shown.
Figure 4:
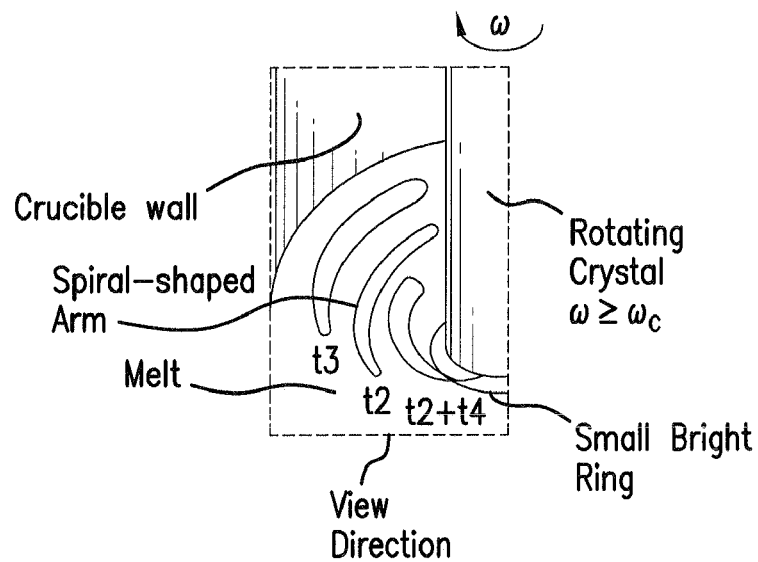
FIG. 4 is a diagrammatic perspective view of the observable convection (spiral-shaped arms) on a surface of a melt during crystal growth, wherein $t_1$-$t_4$ are different time points of a one-time pass of an "arm" (8-9 passes per minute)

In the method according to the invention a seed crystal with a small diameter, which is oriented in the desired direction, is immersed in a melt of crystal raw material, especially a highly pure material, and is slowly drawn out of the melt in a vertical direction while it is rotated and while heat is removed from the melt. During this growing process the drawing speed of the rotating crystal seed is first set so that it increases from a small diameter (FIG. 3a at A) to a large desired diameter (FIG. 3a at B). One type of drawing with an increase of diameter can start in the method according to the invention with a convex cone-shaped growth front according to the state of the art. In this first stage it is also not necessary to take care to avoid temperature fluctuations. In this stage the growing crystal can have a fishtail pattern according to the state of the art (FIG. 2b). When the crystal has reached the desired diameter (FIG. 3 at B), it is grown further to reach a desired length or height, which is at least one third, especially at least one half, and preferably at least equal to its diameter. Preferably the crystal has a diameter, which is 0.3 to 0.75 times the melt vessel diameter. However a crystal diameter that is 0.4 to 0.6 times the melt vessel diameter is particularly preferred. As soon as the cylindrical portion of the growing crystal has reached its desired length and diameter, which is determined by weighing the crystal and/or the melt in the same manner as in the prior art, the growing procedure is changed over, the convex cone-shaped growing tip is melted by increasing the rotation speed and/or supplying additional heat, and the entire crystal is re-melted along a small part of its current height Δh. The re-melting occurs, e.g. in crystals with a diameter up to 50 mm, appropriately over Δh>2 mm. In crystals with larger diameters e.g. up to 80 mm, the re-melting occurs, preferably over a height Δh>5 mm. In crystals with very larger diameters e.g. up to 120 mm, the re-melting occurs, preferably over a height Δh>10 mm. Subsequently the method according to the invention is controlled so that the crystal is grown with a planar phase boundary surface. During this stage of the method the heat radiated from the surface of the liquid crystal melt is detected. The detected measured signal in the ideal case changes according to a continuously changing process as a result of the continuously decreasing filling state. If the detected signal now shows an upward or downward deviation from the normal continuously changing growing process, the rotation speed is increased or decreased until the detected measured signal again corresponds to the continuously changing ideal curve. Typically changes of the rotation speed for regulation of individual deviations or fluctuations amount to 0.01 to 0.5 revolutions per minute, while an absolute rotation speed of 5 to 10 rpm is appropriate in stationary operation with large crystals in the method according to the invention. If greater deviations or fluctuations occur during growth, the crystal defects produced can be removed again by a controlled re-melting according to the invention without further difficulties. The growth of the crystal according to the invention preferably occurs in the (100)-direction, but it is also possible to draw the crystal in the (111)-direction.

The procedure according to the invention divides the complex control system used for controlling the crystal manufacturing method into plural method stages (partially described already above—see FIG. 3). The directions of individual or multiple convection flows within the crystal melt are formed definitely differently in temporally matched sequences in the individual method stages. A short equilibration interval of at least 60 sec, preferably at least 2 min, and especially preferably at least 3 min, is introduced between the individual method stages and/or changes of the method parameters, in order to bring the thermal system comprising the melt and the crystal into a quasi-stationary equilibrium state. Preferably only one parameter at a time is changed during a change over from one process stage to the next in the method according to the invention. The parameters that are changed during the change over include temperature of the melt, temperature of the after-heater, heating power, drawing speed, and rotation speed. If more than one parameter must be changed during change over from one process stage to the next (e.g. stage Q in FIG. 3—re-melting), these changes occur one after the other and always after a new stationary state has been reached. During the growth of the useful crystal volume a slight change of the heating power has proven advantageous.

The crystal growing method according to the invention is shown in FIG. 3.

Staring from the first stage A the crystal diameter is increased to the desired size and the crystal grows in the free convection flow regime. After that the crystal displacement and the instantaneous heating power are maintained constant in a second stage B. Subsequently in a further partial stage C the crystal rotation speed is increased to a rotation speed, which permits a respective equilibrium state between the melt and the crystal at each time during the build up of the rotation speed. At these values forced convection is achieved by the rotation, so that the phase boundary surface becomes planar. This value can be set at exactly 0.5 rpm from the characteristic curves for the measured signals 'crystal weight' and 'heat radiated from the surface of the liquid crystal melt'. If this critical rotation speed value is achieved for the forced convection, then after waiting for equilibration to occur the crystal rotation speed is again increased so that the forced convection flow stabilizes and undesirable transitions between force convection and free convection and troublesome temperature oscillations are avoided. This is ended when the partial stage E-F is reached. At the partial stage E-F a re-melting of the crystal occurs in a small region, i.e. ≦1 mm. Growth fluctuations produced in the foregoing partial stages are eliminated by this re-melting. Dilution of the impurities or doping materials with K<1 occurs in the immediate area near the phase boundary surface. Because of that a delayed start of the effective growth speeds is possible. Subsequently the crystal displacement is begun and the growth proceeds under forced convection flow until it is finished. Typical rotation speeds for the crystal according to the invention with a diameter of preferably at least 80 mm are about 5 rpm during the stage in which the diameter of the crystal increases, about 15 rpm during the stage in which the cone tip is flattened. The rotation speed is decreased to about 10 rpm during the course of the subsequent crystal growing. The rotation speed often amounts to about 5 rpm toward the end of crystal growth.

The crystal is drawn further with the same diameter after forced convection is attained in the crystal melt during the method according to the invention, without changing the heating power (small heating power is still possible). It has been shown that statistical and uncontrollable temperature variations, so-called stochastic temperature fluctuations, which lead to local growth interference, can be prevented by means of the method according to the invention. These sorts of crystal growth interferences are eliminated when the crystal is grown by the method according to the invention, generally without more by re-melting and thereby removal of existing defects.

The method according to the invention is performed especially in a Czochralski apparatus, which has a crucible after-heating system, in which the drawn single crystal remains until the end of the growing process. This sort of crucible after-heating chamber is preferably thermally well insulated. Principally radial and/or axial temperature gradients are maintained as uniform as possible during the growth of the crystal. A noble metal cylinder (e.g. made of iridium) arranged over the actual growing crucible, which causes a great reduction of the axial temperature gradient and prevents temperature fluctuations, has proven to be especially useful. In the method according to the invention it is preferred to perform additional temperature measurements at the after-heater and/or at the crucible base above spacer pins arranged there, especially made of iridium or another crucible material, and/or by means of a high temperature noble metal thermo-element. With this sort of thermo-element an outstanding recordation of relative temperature fluctuations is possible during the melting process and especially on the melt upper surface.

In a preferred embodiment a maximum of 50%, especially a maximum of 45%, of the melt volume is used for the actual crystal growth in order to attain a maximum uniformity, since the slightest impurities with a distribution coefficient of k<<1 can already lead to non-uniformities because of the concentration enrichment in the lower part of the crystal. In an entirely preferred embodiment only a maximum of 40%, especially a maximum of 35%, of the melt volume is used for crystal growth. The use of a maximum amount of only 30% of the melt volume for crystal growth has proven to be most appropriate in certain individual cases.

The crystal diameter is next reduced to a minimum (typically from 5 to 15%) by an increase in the drawing speed at the end of the crystal growth in a preferred procedure according to the invention and then under spreading conditions the residual melt is removed from the melt crucible. Since the useful crystal remains within the crucible and after-heating configuration with a lumpy or bulbous melt residue suspended from it after the foregoing emptying and is cooled in the usual way until at room temperature, negative effects of the melt residue on the quality of the actual structure of the crystal are avoided. However these features lead not only to an improvement of the crystal uniformity but also to an increase of the useful life of the growth crucible, since it does not need to be separated from a residual solidified crystal melt by mechanically hammering or chiseling it out from the solidified crystal melt. Because of that it is also possible to use rhenium instead of iridium for the growth crucible. The unusable bulbous or lumpy solidified melt residue may be recovered without more by means of a hammer blow.

Figure 5:
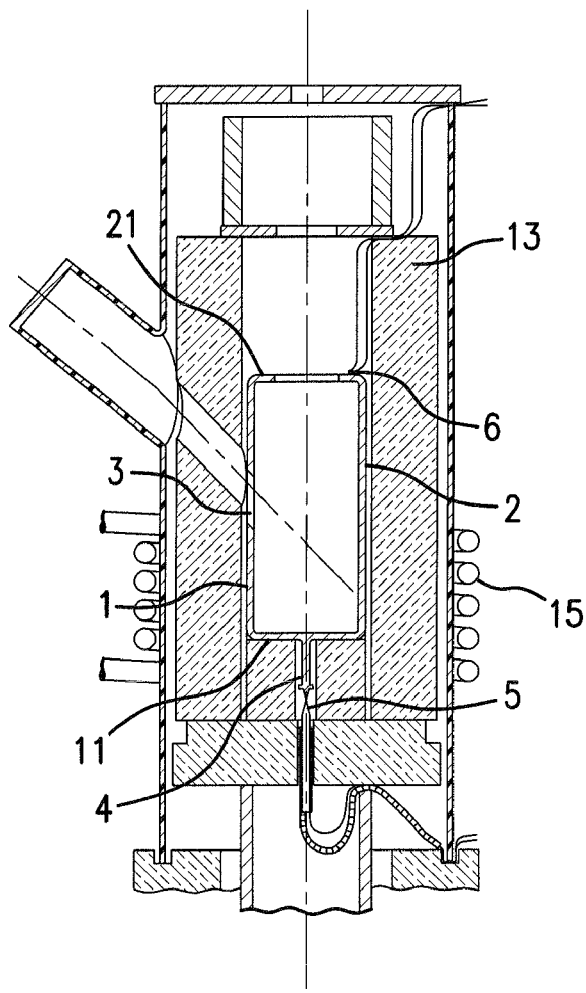
FIG. 5 is a cross-sectional view through an apparatus for growing crystals according to the method of the invention.
Figure 6A:
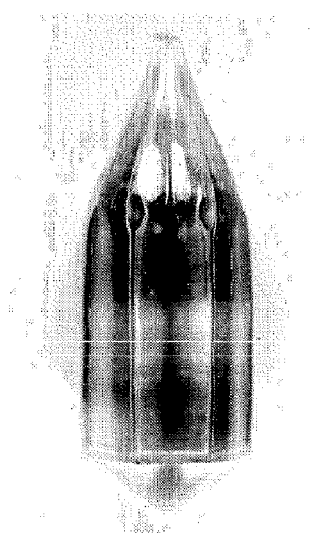
FIGS. 6a to 6b show a crystal made according to the prior art methods for comparison with a crystal made according to the method of the invention, which is shown in FIGS. 6c to 6e; both the crystal of the prior art and the crystal according to the invention are shown between crossed polarizers under white light.
Figure 6C:
Figure 6B:
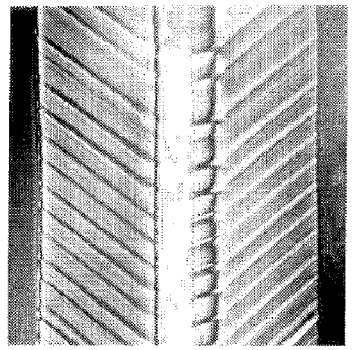
Figure 6D:
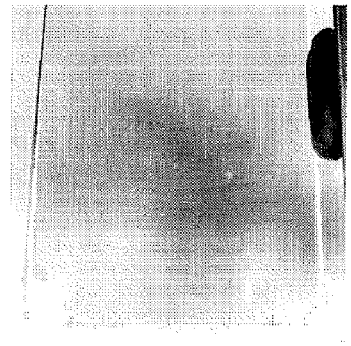
Figure 6E:
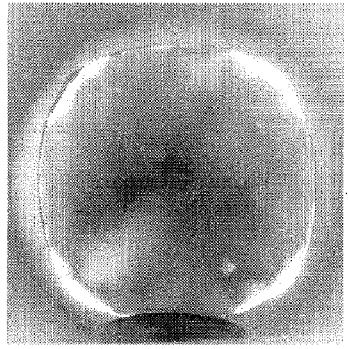

One embodiment of an apparatus according to the invention for preparation the above-described improved single crystal is shown in FIG. 5. An after-heating device, e.g. an after-heating pot 2, is arranged above a growth crucible 1 for containing the melt. The growth crucible 1 preferably comprises a noble metal. Preferably the crucible 1 or the pot 2 is provided with a lateral opening 3, by which the growing process can be observed from the outside. An insulating material 13 circumferentially surrounds the crucible 1 and pot 2 which are heated by means of an induction and/or resistance heater 15. A ceramic material is a preferred insulating material, especially in the form of a fiber mat. Rock wool can also be used. The melt crucible has a spacer pin 4 arranged on its lower end or side 11, which preferably is made of the same material as the crucible 1 and which has a measuring element and temperature sensor 5 spaced from the crucible 1, by which the temperature and the temperature changes can be accurately followed in the melt. One type of spacer pin 4 acts as a heat sink, which provides free convection in the melt and thus thorough mixing. The arrangement according to the invention has a thermo-sensor 6 on an upper side of the after-heater 2, which detects the heat radiation emitted from the melt surface. One type of heat sensor 6 can, for example, be a thermo-bead 6. This sort of thermo-bead detects the radiated heat received by the pot upper side. Thermo-elements, such as a thermo-bead, are suitable radiation receivers. However they can also be thermo-resistors or even pyrometers, etc, such as an infrared sensor, which detects the temperature fluctuations of the melt surface.

The after-heating device 2 has a signal processing unit (not shown) in a preferred embodiment to minimize temperature fluctuations, which for example is controlled by an electronic four-point temperature controller or even a processor, which controls the temperature of the after-heating device 2. Because of that it is also possible to use this sort of temperature measurement in the after-heater to control the crystal diameter.

In an especially preferred embodiment the temperature sensor, for example, the bead of a thermo-element, is mounted on the upper side of the outer wall of the after-heating device 2. The thermo-sensor is located at a sufficient distance from the hot melt at this special mounting position so that a sufficiently great temperature drop from the melt temperature of about 2000° C. to the temperature at the temperature measurement position, namely about 1650° C., occurs. Thus the alloy used for example for a thermo-element is protected from thermal decomposition at its melting temperature (for example about 1800° C.). Self-aging known to those skilled in the art is thus delayed for these reasons. The thermo-sensor measures the heat energy conducted from the walls of the after-heating system, which is essentially the radiated energy emitted from the melt surface. A portion of this energy from an adjacent surface of the after-heater inner wall is absorbed by the rear-mounted sensor and can thus be measured. Commercially obtainable or already existing growing apparatus can be equipped so that they can perform the crystal growing method according to the invention, because of this procedure according to the invention. This procedure according to the invention guarantees a reliable detection of the temperature of a part of the melt, i.e. its surface, so that changes in the growing process, such as reduction of the melt height due to consumption of material or changes in the flow regime are reliably and clearly determinable.

However the invention also concerns single crystals obtained by the method according to the invention. Cubic garnet crystals, cubic spinel crystals, cubic perovskite crystals, cubic II/IV oxide crystals, such as crystals made of highly crystalline silicon, and corundum single crystals are preferred according to the invention. Preferred crystals especially include garnets of the general formula I:

$$(A_{1-x}D_x)_3Al_5O_{12} \qquad (I),$$

wherein D is an element of similar ionic radius and valence with $A^{+3}$ in order to keep the lattice distortions as small as possible. Elements A preferred according to the invention include yttrium, rare earths, and/or lanthanides, i.e. Ce, Pr, Nd, Pm, Sm, Eu, Gd, Tb, Dy, Ho, Er, Tm, Yb, Lu, and scandium. The elements Y, Lu, Yb, Tm, Dy, and Sc are especially preferred. Suitable doping agents D similarly are selected from the group consisting of yttrium, rare earths, and scandium. Garnets of the type $Y_3Al_5O_{12}$, $Lu_3Al_5O_{12}$, $Dy_3Al_5O_{12}$, $Tm_3Al_5O_{12}$, $Yb_3Al_5O_{12}$, and especially mixed crystals of the formula:

$$(Y_{1-x}Lu_x)_3Al_5O_{12},$$

which are doped with rare earths and/or Sc, have proven to be especially suitable, wherein x is the mole fraction and $0 \leq x \leq 1$. Preferably A and D are different from each other. When A and D are equal, x=0. This crystal cannot then be doped. According to the invention those mole fractions are used, which are the same for the melt and the crystal, i.e. those mole fractions, which do not change when the material crystallizes. In so far as optical elements are made, which have a composition, in which the material crystallizes out in a different composition from that of the melt, then understandably according to the invention it is possible to maintain the percent composition of the melt by addition of ingredients depleted from the melt and thus to maintain the mole fraction constant in the solid crystal throughout the entire growing process.

$MgAl_2O_4$, Ghanospinel $(Mg, Zn)Al_2O_4$, $CaAl_2O_4$, $CaB_2O_4$, and/or lithium spinel $LiAl_5O_8$ have proven especially suitable as the spinel for use in making the single crystals according to the invention.

$BaZrO_3$ and/or $CaCeO_3$ are especially preferred cubic perovskites. $(Mg,Zn)O$ is suitable as a cubic II/VI oxide.

The single crystal made by the method of the invention is especially characterized by a diameter of at least 50 mm, preferably at least 100 mm. However a minimum size of 120 mm, especially of 150 mm, is especially preferred. It is even better if the single crystal according to the invention has a diameter of 160 mm, especially 180 mm, but a diameter of at least 200 mm is still more preferably.

The crystal according to the invention with a diameter of at least 50 mm has no visually observable growth strips in a fishtail pattern when an axially cut out sample of the crystal is placed between crossed polarizers and observed with normal white light. In addition, preferably no horizontal growth strips are observable.

Preferably the crystals made by the method have no ring-like bright or dark regions, but are characterized by at most only shadow-like brightness differences, when a sample disk with a thickness of 2 mm is observed in the growth direction in a central region with a diameter comprising 80% of the diameter of the disk.

The stress birefringence at 193 nm, which is observed in the growth direction in a central region with a diameter that 80% of the diameter of the crystal, is less than 1 nm/cm and the index of refraction uniformity Δn is less than 1 ppm for a single crystal according to the invention with a diameter of at least 50 mm. Crystals that are not doped are especially preferred.

The crystals according to the invention preferably have a purity of at least 99.999%, especially at least 99.9999%.

Furthermore they are characterized by a (100)-orientation or a (111)-orientation in the growing direction.

The invention also encompasses the use of the crystals according to the invention and/or crystals obtained by the method of the invention for making lenses, prisms, laser rods, optical windows, optical components for DUV photolithography, steppers, lasers, especially excimer lasers, computer chips, as well as integrated circuits and electronic devices, which contain such integrated circuits and chips. The invention also encompasses the use of the single crystals of the invention for making wafers for LEDs and for photovoltaic devices.

The disclosure in German Patent Application DE 10 2005 043 623.4 of Sep. 13, 2005 is incorporated here by reference. This German Patent Application describes the invention described hereinabove and claimed in the claims appended herein below and provides the basis for a claim of priority for the instant invention under 35 U.S.C. 119.

While the invention has been illustrated and described as embodied in a method of making highly homogeneous, low-stress single crystals with a predetermined orientation by immersing a single crystal in a melt and slowly drawing the single crystal out of the melt while crystallization is occurring, an apparatus for performing the method for making the crystals, and the crystals made by the method and their uses, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A low-stress crystal of formula (I):

$$(A_{1-x}D_x)_3Al_5O_{12} \qquad (I),$$

wherein $0 \leq x \leq 1$, A=Lu and D=Pr, said low-stress crystal having a stress birefringence of less than 1 nm/cm at 193 nm as measured in a crystal growth direction in a center region with a diameter equal to 80% of a diameter of the crystal and an index of refraction uniformity Δn of less than 1 ppm;

wherein said low-stress crystal is obtainable by a method comprising the steps of:

a) dipping a single crystal of said formula (I) that is held at a temperature under a melting point of a crystal raw material of said formula (I) in a melt of the crystal raw material so as to form a solid-liquid phase boundary surface;

b) drawing said single crystal dipped into the melt in step a) out from the melt vertically with respect to a melt surface so as to grow the single crystal in a particular orientation;

c) conducting heat away during the drawing of the single crystal in step b);

d) during the drawing of the single crystal in step b), rotating the single crystal and the melt relative to each other with a controllable rotation speed;

e) detecting at least one characteristic surface temperature of the melt surface and/or of a crystal surface of the single crystal close to the melt surface by measuring heat energy radiated therefrom; and f) when temperature fluctuations of the at least one characteristic surface temperature are detected, increasing or decreasing said rotation speed in order to control said at least one characteristic surface temperature and to adjust said phase boundary surface between the single crystal and the melt so that said phase boundary surface is planar.

2. The low-stress crystal as defined in claim 1, wherein said method comprises growing the single crystal in the particular orientation by means of a super seed crystal, said super seed crystal having a diameter that corresponds to that of the single crystal to be grown.

3. The low-stress crystal as defined in claim 1, wherein said method comprises tempering the single crystal in an after-heating chamber after finishing crystal growth and removing residual melt.

4. The low-stress crystal as defined in claim 1, wherein said method comprises rinsing an interior of a crucible containing the melt with an inert gas and heating the single crystal in an after-heater interior during crystal growth and/or during tempering.

5. A low-stress crystal of formula (I):

$$(A_{1-x}D_x)_3Al_5O_{12} \qquad (II)$$

wherein $0 \leq x \leq 1$, A=Lu and D=Pr, said low-stress crystal having a stress birefringence of less than 1 nm/cm at 193 nm as measured in a crystal growth direction in a center region with a diameter equal to 80% of a diameter of the crystal and an index of refraction uniformity $\Delta n$ of less than 1 ppm and no visible growth strips in a fishtail pattern when a 2-ram thick sample between crossed polarizers is observed with normal white light;

wherein said low-stress crystal is obtained by a method comprising the steps of:

a) dipping a single crystal of said formula (I) held at a temperature under a melting point of a crystal raw material of said formula (I) in a melt of the crystal raw material so as to form a solid-liquid phase boundary surface;

b) drawing said single crystal dipped into the melt in step a) out from the melt vertically with respect to a melt surface so as to grow the single crystal in a particular orientation;

c) conducting heat away during the drawing of the single crystal in step b);

d) during the drawing of the single crystal in step b), rotating the single crystal and the melt relative to each other with a controllable rotation speed;

e) detecting at least one characteristic surface temperature of the melt surface and/or of a crystal surface of the single crystal close to the melt surface by measuring heat energy radiated therefrom; and f) when temperature fluctuations of the at least one characteristic surface temperature are detected, increasing or decreasing said rotation speed in order to control said at least one characteristic surface temperature and to adjust said phase boundary surface between the single crystal and the melt so that said phase boundary surface is planar.

6. The low-stress crystal as defined in claim 5, wherein said method comprises growing the single crystal in the particular orientation by means of a super seed crystal, said super seed crystal having a diameter that corresponds to that of the single crystal to be grown.

7. The low-stress crystal as defined in claim 5, wherein said method comprises tempering the single crystal in an after-heating chamber after finishing crystal growth and removing residual melt.

8. The low-stress crystal as defined in claim 5, wherein said method comprises rinsing an interior of a crucible containing the melt with an inert gas and heating the single crystal in an after-heater interior during crystal growth and/or during tempering.

* * * * *